US008603921B2

(12) United States Patent
Shimizu et al.

(10) Patent No.: US 8,603,921 B2
(45) Date of Patent: Dec. 10, 2013

(54) MAINTAINING MASK INTEGRITY TO FORM OPENINGS IN WAFERS

(75) Inventors: Daisuke Shimizu, Milpitas, CA (US); Jong Mun Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 11 days.

(21) Appl. No.: 13/190,392

(22) Filed: Jul. 25, 2011

(65) Prior Publication Data

US 2013/0029484 A1    Jan. 31, 2013

(51) Int. Cl.
*H01L 21/302* (2006.01)
*H01L 21/461* (2006.01)

(52) U.S. Cl.
USPC ............. 438/738; 438/637; 257/E21.232

(58) Field of Classification Search
USPC ............................................. 438/738
See application file for complete search history.

(56) References Cited

U.S. PATENT DOCUMENTS

| 6,518,206 | B1 * | 2/2003 | Kumar et al. | 438/585 |
|---|---|---|---|---|
| 2008/0185364 | A1 * | 8/2008 | Kon et al. | 216/51 |
| 2009/0123875 | A1 * | 5/2009 | Soda | 430/316 |
| 2010/0270627 | A1 * | 10/2010 | Chang et al. | 257/411 |

OTHER PUBLICATIONS

Nakano, Toshiki, et al., "Electron population above 13.5 eV in ultrahigh frequency and inductively coupled plasmas through $C_2F_4$/$CF_3I$ and $C_4F_8$/Ar gas mixtures," J. Vac. Sci. Technol. B 18(6), Nov./Dec. 2000, pp. 2774-2779.
Ohtake, H. et al., "Charging-damage-free and precise dielectric etching in pulsed $C_2F_4$/$CF_3I$ plasma," J. Vac. Sci. Technol. B 20(3), May/Jun. 2002, pp. 1026-1030.
Samukawa, Seiji, et al., "Effects of Discharge Frequency in Plasma Etching and Ultrahigh-Frequency Plasma Source for High-Performance Etching for Ultralarge-Scale Integrated Circuits," Jpn. J. Appl. Phys. vol. 39 (2000) pp. 1583-1596.

* cited by examiner

*Primary Examiner* — Michelle Mandala
*Assistant Examiner* — Shaka White
(74) *Attorney, Agent, or Firm* — Blakely Sokoloff Taylor & Zafman LLP

(57) ABSTRACT

One or more openings in an organic mask layer deposited on a first insulating layer over a substrate are formed. One or more openings in the first insulating layer are formed through the openings in the organic mask using a first iodine containing gas. An antireflective layer can be deposited on the organic mask layer. One or more openings in the antireflective layer are formed down to the organic mask layer using a second iodine containing gas. The first insulating layer can be deposited on a second insulating layer over the substrate. One or more openings in the second insulating layer can be formed using a third iodine containing gas.

13 Claims, 7 Drawing Sheets

700

```
┌─────────────────────────────────────────────────────────────┐
│  DEPOSIT AN ORGANIC MASK ON AN INSULATING LAYER OVER A      │
│                         SUBSTRATE                            │
│                            701                               │
└─────────────────────────────────────────────────────────────┘
                              │
                              ▼
┌─────────────────────────────────────────────────────────────┐
│  FORM ONE OR MORE OPENINGS IN THE INSULATING LAYER USING A GAS │
│  CONTAINING IODINE TO MAINTAIN INTEGRITY OF THE ORGANIC MASK │
│                            702                               │
└─────────────────────────────────────────────────────────────┘
```

FIG. 7

MAINTAINING MASK INTEGRITY TO FORM OPENINGS IN WAFERS

FIELD

Embodiments of the present invention pertain to the field of electronic device manufacturing, and in particular, to forming openings in wafers.

DESCRIPTION OF RELATED ART

In semiconductor wafer processing, integrated circuits are formed on a wafer that includes a semiconductor material. In general, layers of various materials which are either semiconducting, conducting or insulating are utilized to form the integrated circuits. These materials are doped, deposited and etched to form integrated circuits.

Decreasing the dimensions of semiconductor devices and increasing the level of their integration are two of the major trends in the current semiconductor device manufacturing field. As a result of these trends, the density of elements forming a semiconductor device continuously increases. The shrinkage of the semiconductor devices down to submicron dimensions requires that the routine fabrication of their elements also be performed on the submicron level. In addition, to increase the level of the device integration, semiconductor structures forming semiconductor devices may be stacked on top of each other.

Plasma etching is a form of plasma processing used to fabricate integrated circuits. It typically involves a high-speed stream of glow discharge (plasma) of an appropriate gas mixture being shot at a wafer. The plasma can contain ions and/or neutral atoms and radicals. During the etching process, volatile etch products may be produced from the chemical reactions between the elements of the material etched and the reactive species generated by the plasma.

Typically, a chip is fabricated using many layers of films. Each of these layers may be created using a mask that dictates the pattern of the layer. The accuracy of this pattern is extremely critical in manufacturing the chip. Typically, during the etching process free radicals such as fluorine or chlorine are created. These free radicals may react with the mask material and erode the mask. Varying the gas pressure and/or power applied to the plasma etching chamber may not help in preventing from damaging the mask by free radicals. As a result, the mask integrity during the etching process is not maintained that negatively affects on the accuracy of the pattern crucial in the semiconductor chip manufacturing.

SUMMARY

Embodiments of the present invention include methods and apparatuses to maintain mask integrity to form openings in wafers for an electronic device manufacturing. In at least one embodiment, one or more openings in an organic mask layer deposited on a first insulating layer over a substrate are formed. One or more openings in the first insulating layer are formed through the openings in the organic mask using a first iodine containing gas. The first iodine containing gas further contains a carbon and fluorine. One or more openings in the organic mask can be formed using a gas.

In at least one embodiment, an antireflective layer is deposited on the organic mask layer. One or more openings in the antireflective layer are formed down to the organic mask layer using a second iodine containing gas. In at least some embodiments, the first insulating layer is deposited on a second insulating layer over the substrate. One or more openings in the second insulating layer can be formed using a third iodine containing gas. In at least some embodiments, the organic mask layer is removed, and one or more conductive layers is deposited into at least one of the openings in the insulating layer.

In at least one embodiment, an antireflective layer is etched down to an organic mask layer on a first insulating layer over a substrate using a first iodine containing gas The antireflective layer is deposited on the organic mask layer. One or more openings are formed in the organic mask layer. The first insulating layer is etched through the one or more openings in the organic mask using a second iodine containing gas to maintain an integrity of the organic mask. In at least one embodiment, the antireflective layer contains a dielectric layer. A photoresist layer can be patterned on the antireflective layer. In at least one embodiment, the first insulating layer is on a second insulating layer over the substrate. The second insulating layer is etched through one or more openings in the first insulating layer using a third iodine containing gas.

In at least one embodiment, a system to manufacture an integrated circuit has a plasma etch chamber. The plasma etch chamber has a stage to position a wafer having an organic mask layer on a first insulating layer over a substrate. The plasma etch chamber has an inlet to input a first iodine containing gas. At least one power source is coupled to the plasma etch chamber. The plasma etch chamber is configured to form one or more openings in an organic mask layer on a first insulating layer over a substrate. Further, the plasma etch chamber is configured to form through the openings in the organic mask layer one or more openings in the first insulating layer using a first iodine containing gas. The plasma etch chamber has an outlet to remove a second iodine containing gasiodine containing gas from the wafer. In at least some embodiments, an antireflective layer is deposited on the organic mask layer. The plasma etch chamber can be further configured to etch one or more openings in the antireflective layer down to the organic mask layer using a second iodine containing gasiodine containing gas.

In at least one embodiment, the first insulating layer is on a second insulating layer over the substrate. The plasma etch chamber can be further configured to form one or more openings in the second insulating layer using a third iodine containing gas.

Other features of the present invention will be apparent from the accompanying drawings and from the detailed description which follows.

BRIEF DESCRIPTION OF THE DRAWINGS

FIG. 7 shows a flowchart of an exemplary embodiment of a method to maintain mask integrity while forming one or more openings in a wafer.

DETAILED DESCRIPTION

Figure 1:
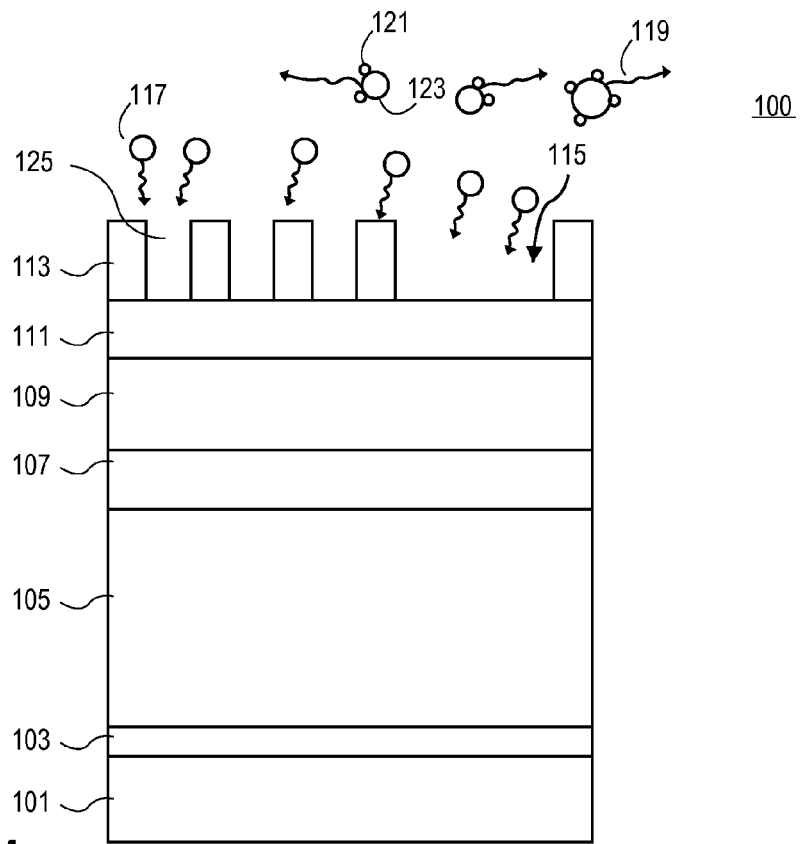
FIG. 1 is a cross-sectional view of an exemplary embodiment of a wafer having an organic mask layer over a substrate.

Methods and apparatuses to maintain mask integrity to form openings in wafers for an electronic device manufacturing are described herein. In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

FIG. 7 shows a flowchart of an exemplary embodiment of a method 700 to maintain mask integrity while forming one or more openings in a wafer. Method 700 begins with operation 701 involving depositing an organic mask on an insulating layer over a substrate, as described in further detail below. At operation 702 one or more openings in the insulating layer are then formed through the organic mask using a gas containing iodine, as described in further detail below. Using the gas containing iodine to form the openings can preserve integrity of the organic mask above the insulating layer. More specifically, addition of the iodine containing gas in a High Aspect Ratio Contact ("HARC") baseline plasma etch process provides facet-free, stration-free mask profile and increases mask selectivity relative to the plasma etching process without the iodine containing gas.

According to Energy Dispersive X-ray spectroscopy ("EDX") analysis results, the HARC baseline process with addition of the iodine containing gas provides a mask having higher silicon containing polymer than the baseline process without the iodine containing gas addition. The higher silicon containing polymer results in stronger rectangle mask profile. The stronger mask profile can lead to more accuracy in Critical Dimension ("CD") control during etching and higher selectivity of the mask, as described in further detail below.

FIG. 1 is a cross-sectional view of an exemplary embodiment of a wafer 100 having an organic mask layer 109 over a substrate 101. In one embodiment, substrate 101 includes a semiconductor, e.g., silicon, germanium, or any other semiconductor. In at least some embodiments, substrate 101 comprises any material to make any of integrated circuits, passive (e.g., capacitors, inductors) and active (e.g., transistors, photo detectors, lasers, diodes) microelectronic devices. Substrate 101 may include insulating (e.g., dielectric) materials that separate such active and passive microelectronic devices from a conductive layer or layers that are formed on top of them. In one embodiment, substrate 101 is a monocrystalline silicon ("Si") substrate that includes one or more dielectric layers e.g., silicon dioxide, silicon nitride, sapphire, and other dielectric materials.

A lower insulating layer 103 can be optionally deposited on the substrate 101 using one of techniques known to one of ordinary skill in the art of electronic device manufacturing. Lower insulating layer 103 can be any dielectric material, for example, an oxide, nitride, or a combination thereof. In one embodiment lower insulating layer 103 is a silicon nitride. In one embodiment lower insulating layer 103 is a silicon oxide. In at least some embodiments, the thickness of the lower insulating layer 103 is in the approximate range from about 20 nanometers ("nm") to about 50 nm.

As shown in FIG. 1, an insulating layer 105 is deposited on lower insulating layer 103. In at least some embodiments, insulating layer 105 can be deposited directly onto substrate 101. An insulating layer 105 can be any dielectric material, for example, an oxide, a nitride, or a combination thereof. In one embodiment, insulating layer 105 is a silicon oxide. In at least some embodiments, insulting layer 105 is a silicon nitride. In at least some embodiments, lower insulating layer 103, such as silicon nitride is sandwiched between substrate 101 and insulating layer 105, such as silicon oxide. In at least some embodiments, the thickness of insulating layer 105 is from about 100 nm to about 3000 nm depending on a required device. Insulating layer 105 can be deposited over substrate 101 using one of techniques known to one of ordinary skill in the art of electronic device manufacturing.

An upper insulating layer 107 can be optionally deposited on insulating layer 105 using one of techniques known to one of ordinary skill in the art of electronic device manufacturing. Upper insulating layer 107 can be any dielectric material, for example an oxide, nitride, or a combination thereof. In one embodiment upper insulating layer 107 is a silicon nitride. In one embodiment upper insulating layer 107 is a silicon oxide. In one embodiment, upper insulating layer 107, such as a silicon nitride layer, is deposited onto insulating layer 105, such as a silicon oxide layer. In at least some embodiments, the thickness of the upper insulating layer 107 is from about 50 nm to about 300 nm.

As shown in FIG. 1, an organic mask layer 109 is deposited onto upper insulating layer 107. In at least some embodiments, organic mask layer 109 can be deposited directly to insulating layer 105. In at least some embodiments, organic mask layer 109 is a polymer hard mask layer. In at least some embodiments, mask layer 109 is a carbon hard mask layer. In at least some embodiments, mask layer 109 is a strippable amorphous carbon hard mask layer. For example, organic mask layer 109 includes one or more of Advanced Patterning Film ("APF") carbon hard masks produced by Applied Materials, Inc., located in Santa Clara, Calif. Generally, the purpose of the hard mask layer is to protect specific regions of the one or more layers covered by the hard mask from unnecessary etching. Because photoresist may erode during etching of the underlying layer, the hard mask layer is deposited between the underlying layer and a photoresist layer. Organic mask layer 109 can be deposited onto layer 107 or layer 105 using one of techniques known to one of ordinary skill in the art of electronic manufacturing. In at least some embodiments, APF layer is deposited onto layer 107 or layer 105, using for example, a Plasma-Enhanced Chemical Vapor Deposition ("PECVD") process. Generally, the thickness of the organic hard mask layer 109 depends on an application. In at least some embodiments, organic hard mask layer 109 has the thickness from about 100 nm to about 1200 nm.

As shown in FIG. 1, an antireflective coating ("ARC") layer 111 is deposited on organic mask layer 109. Typically, ARC layer 111 is deposited underneath of a photoresist layer to absorb the scattered UV light during Ultraviolet lithography ("UV") lithography to increase accuracy of transferring a pattern from the photoresist to the underlying layer. Generally, UV lithography employs the radiation ("light") having wavelengths in the approximate range of 10 nanometers ("nm") to 300 nm that enables to print features having a size smaller than 1 micron, for example from about 20 nm to about 60 nm. In at least some embodiments, an antireflective coating layer 111 includes a bottom polymer antireflective coating layer ("BARC") having the thickness from about 250 angstroms ("Å") to about 350 Å deposited on a dielectric antireflective coating layer ("DARC") having the thickness from about 400 Å to about 800 Å. In at least some embodiments, the DARC layer of the antireflective coating layer 111 is silicon oxide nitride. ARC layer 111 can be deposited onto organic hard mask layer 111 using one of techniques known to one of ordinary skill in the art of electronic device manufacturing.

As shown in FIG. 1, a photoresist layer 113 is deposited onto ARC layer 111. A photoresist layer 113 is patterned to form one or more openings, for example, an opening 115 and an opening 125. Depositing and patterning of the photoresist is known to one of ordinary skill in the art of electronic device manufacturing. In one embodiment, photoresist 113 is a positive tone photoresist. In another embodiment, photoresist 113 is a negative tone photoresist. In one embodiment, photoresist 113 is UV Lithography photoresist. In one embodiment, photoresist 113 includes fluoropolymers. In another embodiment, photoresist 113 includes silicon-containing polymers. In one embodiment, photoresist 113 includes hydroxy styrene and/or acrylic acid monomers to provide acid groups when photoresist is exposed to radiation. Generally, the choice of the material for photoresist 113 depends on a particular microelectronic device processing application. In particular, the choice of the material for photoresist 113 depends on the properties of the photoresist at a given wavelength of radiation. In alternate embodiments, photoresist 113 is optimized to a wavelength of radiation, e.g., 365 nm, 248 nm, 193 nm, 157 nm, and 13 nm. In one embodiment, photoresist 113 is an ArF photoresist. In another embodiment, photoresist 113 is a KrF photoresist.

Figure 8:
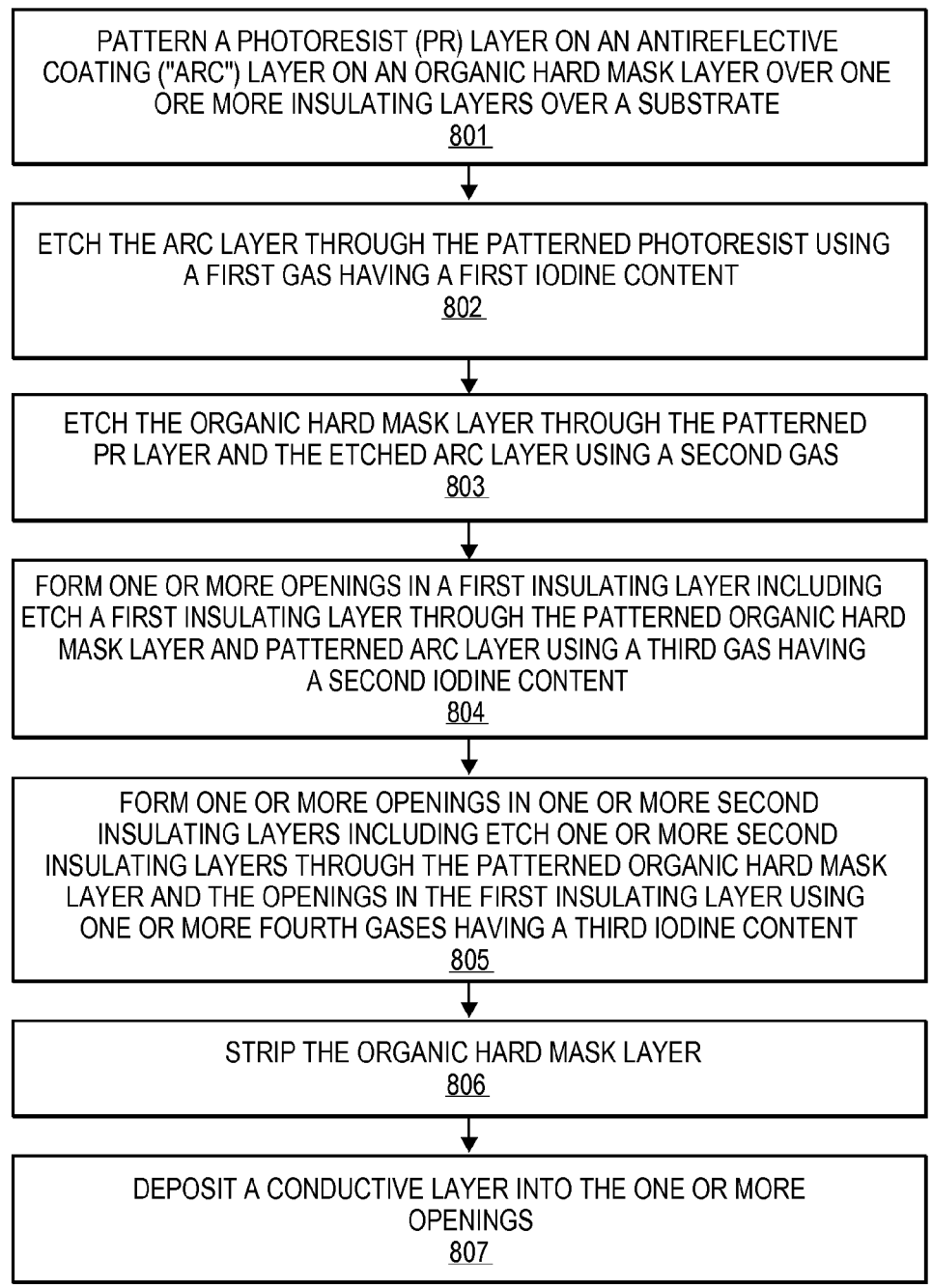
FIG. 8 shows a flowchart of an exemplary embodiment of a method to manufacture an integrated circuit.

FIG. 8 shows a flowchart of an exemplary embodiment of a method 800 to manufacture an integrated circuit. Method 800 begins with operation 801 involving patterning a photoresist layer on an ARC layer on an organic hard mask layer over a substrate, as described above. In at least some embodiments, the organic hard mask layer is a polymer hard mask layer. Method 800 continues with operation 802 involving etching the ARC layer through the patterned photoresist layer using a first gas having a first iodine content.

Referring back to FIG. 1, ARC layer 111 is plasma etched through the openings in the photoresist, such as openings 115 and 121, using a process gas 117 having at least one iodine containing gas. In at least some embodiments, process gas 117 contains iodine, carbon and fluorine. In at least some embodiments, the at least one iodine containing gas is trifluoroiodomethane ("$CF_3I$"). The iodine containing gas can be $CF_3I$, $C_2F_5I$, $C_3F_7I$, or any combination thereof. In at least some embodiments, process gas 117 includes an iodine containing gas, such as $CF_3I$, $C_2F_5I$, $C_3F_7I$, or any combination thereof that is added to a baseline gas flow containing $C_xH_zF_y$, oxygen, and argon, where x, y can be any integer number excluding zero, and z can be any integer number including zero. In at least some embodiments, the iodine containing gas $CF_3I$ is added to a baseline gas flow containing $C_4F_6$, $C_4F_8$, or any combination thereof, and oxygen, and argon. In at least some embodiments, a content ratio of the iodine containing gas, for example, $CF_3I$, $C_2F_5I$, $C_3F_7I$, or any combination thereof, in the base gas flow is from about 0.1 percents to about 10 percents. In more specific embodiments, about 5 Standard Cubic Centimeters per Minute ("sccm") to about 20 sccm of $CF_3I$ is added to the base gas flow into a plasma etching chamber.

As shown in FIG. 1, iodine molecules, such as an iodine molecule 123, react with aggressive free fluorine radicals $F^*$, such as a free radical 121 in the etching plasma to form inter-halogen compounds, such as an inter-halogen compound 119. Generally, a free fluorine radical is a fluorine in an excited state which can aggressively react with the wafer. Radical reaction can damage a mask during etching an underlying layer.

In at least some embodiments, iodine atoms in gas 117 may react with other halogen atoms to form stable inter-halogen compounds that reduces the amount of the free radicals in plasma thereby minimizing their effect on the photoresist mask 113. That is, adding the iodine containing gas to plasma etch ARC layer 111 allows to preserve the photoresist mask profile.

In at least some embodiments, fluorine ions produced from the iodine containing gas, such as gas $CF_3I$, improve etching efficiency of the ARC layer. That is, adding iodine containing gas, such as $CF_3I$ gas, to the baseline gas flow has a double benefit: it improves the etching efficiency of the underlying layer (e.g., ARC layer 111) and preserves the integrity of the above mask layer (e.g., photoresist 113).

Maintaining the photoresist mask profile results in a substantially striation free etched ARC layer and increases control over the critical dimensions of the etched features of the ARC layer. Additionally, adding an iodine containing gas to etch ARC layer 111 improves line edge roughness ("LER") and provides a substantially vertical profile of an opening in the ARC layer. For example, adding the CF3I gas to the base gas flow to plasma etch the ARC layer can improve LER from about 7.5 nm to about 2.5 nm. In at least some embodiments, the inter-halogen compounds 119 are removed from a wafer placed in a plasma etching chamber by using a vacuum pump, as described in further detail below.

In at least some embodiments, the openings in the ARC layer 111 are plasma etched at temperature in an approximate range of 0° C. to 60° C., and pressure from about 100 millitorrs to about 200 millitorrs. In at least some embodiments, pressure to etch ARC layer 111 is in an approximate range of 10 millitorrs to about 200 millitorrs.

Figure 2:
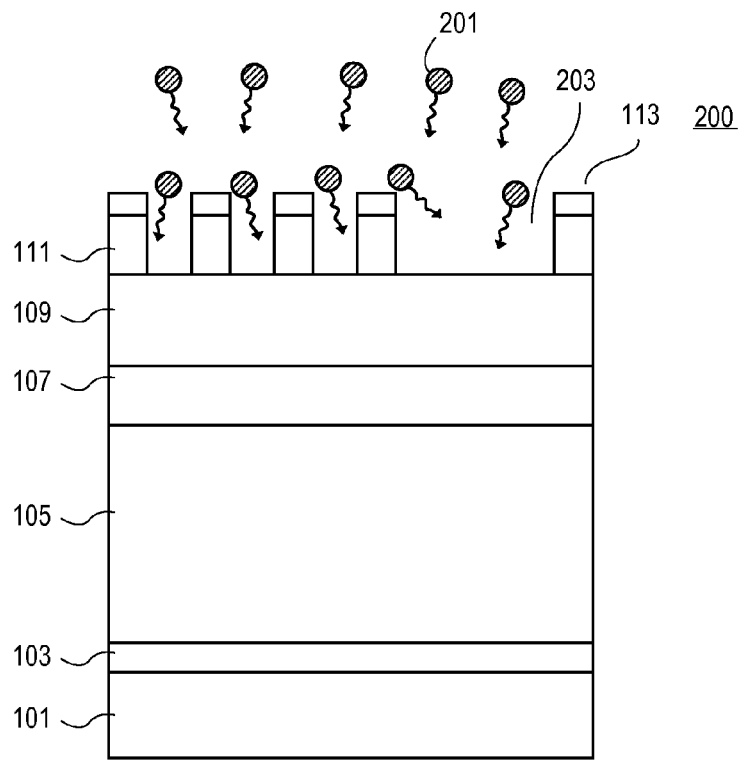
FIG. 2 is a view similar to FIG. 1 after openings in an antireflective coating layer 111 are formed and photoresist is partially etched down during forming the openings.

FIG. 2 is a view similar to FIG. 1 after openings, such as an opening 203 in ARC layer 111 are formed and photoresist 113 is partially etched down during forming the openings. As shown in FIG. 2, portions of the organic hard mask layer 109 are exposed through the openings in ARC layer 111.

Referring back to FIG. 8, method 800 continues with operation 803 that involves etching the organic hard mask layer through the patterned photoresist layer and the etched ARC layer down to an insulating layer over the substrate using a second gas.

As shown in FIG. 2, organic mask layer 109 is plasma etched through the openings, such as opening 203, in ARC layer 111 using an organic mask layer etching gas 201. Gas 201 can be, for example Oxygen, Nitrogen, and Carbonly sulfide. As shown in FIG. 2, etched ARC layer 111 acts as a mask to etch organic mask layer 109. In at least some embodiments, photoresist layer 113 is etched out completely during etching the organic mask layer 109.

Figure 3:
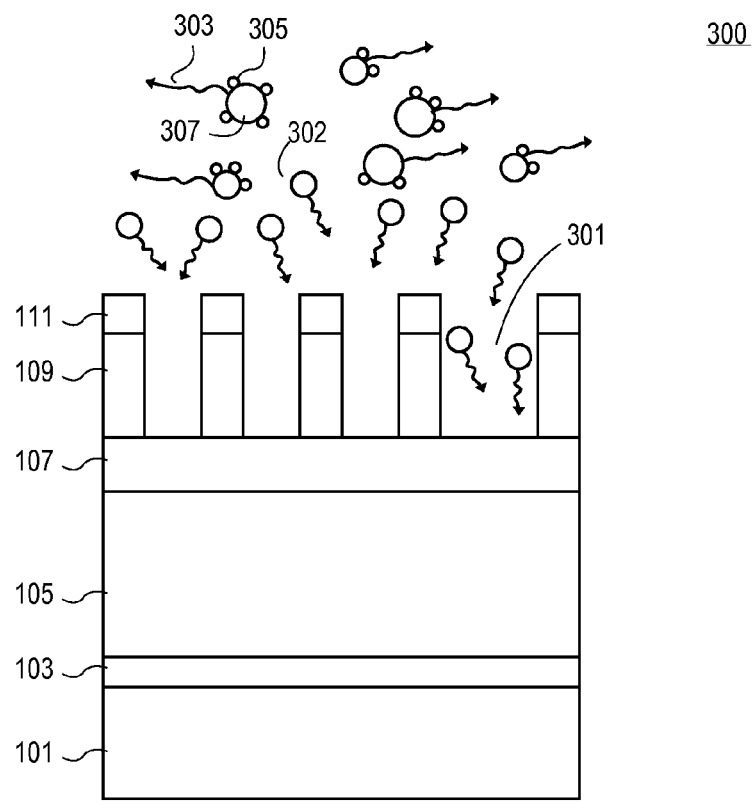
FIG. 3 is a view similar to FIG. 2 after openings in an organic hard mask layer are formed.

FIG. 3 is a view similar to FIG. 2 after openings, such as an opening 301 in organic hard mask layer 109 down to insulating layer 107 are formed. Referring back to FIG. 8, method 800 continues with operation 804 involving forming one or more openings in a first insulating layer that includes etching the first insulating layer through the patterned organic hard mask and patterned ARC layer down to a second insulating layer over the substrate using a third gas having a second iodine content. As shown in FIG. 3, insulating layer 107 (e.g., silicon nitride) is plasma etched through the openings, such as opening 301, in hard mask layer 109 using iodine containing gas 302.

In at least some embodiments, gas 302 contains iodine, carbon and fluorine. In at least some embodiments, gas 302 is trifluoroiodomethane ("$CF_3I$"). In at least some embodiments, gas 302 is $CF_3I$, $C_2F_5I$, $C_3F_7I$, or any combination thereof. In at least some embodiments, gas 302 such as $CF_3I$, $C_2F_5I$, $C_3F_7I$, or any combination thereof is added to a baseline gas flow containing $C_xH_zF_y$, oxygen, and argon, where x, y can be any integer number excluding 0, and z can be any integer number including 0. In at least some embodiments, $CF_3I$ is added to a baseline gas flow containing $C_4F_6$, $C_4F_8$, or any combination thereof, and oxygen, and argon. In at least some embodiments, the ARC layer 111 is removed during etching insulating layer 107, for example, by fluorine containing in gas 302.

In at least some embodiments, a content ratio of the iodine containing gas 302 such as $CF_3I$, $C_2F_5I$, $C_3F_7I$, or any combination thereof in the base gas flow is from about 2% to about 5%. In more specific embodiments, openings in insulating layer 107 (e.g., a SiN layer) are formed by adding about from 10 sccm to about 20 sccm of $CF_3I$ to the base gas flow containing $C_xH_mF_y$, where x, m, and y are integer numbers excluding zero, oxygen, and argon into a plasma etching chamber.

As shown in FIG. 3, iodine molecules, such as an iodine molecule 307, react with aggressive free fluorine radicals F*, such as a free radical 305 in the plasma providing stable inter-halogen compounds, such as an inter-halogen compound 303 that minimizes the effects of the free radicals on the organic mask 109. That is, adding iodine containing gas 302 to plasma etch insulating layer 107 allows maintaining the organic mask integrity during the etching process.

In at least some embodiments, fluorine ions produced from iodine containing gas 302, such as gas $CF_3I$, improve etching efficiency of the insulating layer 107. That is, adding iodine containing gas, such as $CF_3I$ gas, to the baseline gas flow has a double benefit: it improves the etching efficiency of the underlying layer (e.g., layer 107) and preserves the integrity of the above mask layer (e.g., organic mask 109).

Maintaining the organic mask integrity provides a facet free mask profile, and results in a substantially striation free etched insulating layer. Additionally, adding iodine containing gas 302 to etch insulating layer 107 showed a clogging-free hole profile in the insulating layer 107. For example, adding iodine containing gas 302 to etch insulating layer 107 can improve a polymer hard mask selectivity from 1.52 to 2.64. Adding iodine containing gas 302 allowed maintaining top critical dimensions during etching the insulating layer 107. For example, adding $CF_3I$ gas on top SiN open process for High Aspect Ratio Contact ("HARC") showed clogging-free hole profile, striation-free, mask deformation free etched SiN, and clear mask top surface.

In at least some embodiments, the inter-halogen compounds, such as compound 303, are removed from a wafer placed in a plasma etching chamber by using a vacuum pump. In at least some embodiments, the openings in the insulating layer 107 are plasma etched at temperature in an approximate range of 0° C. to 60° C. In at least some embodiments, pressure to etch layer 107 is in an approximate range of 10 millitorrs to about 200 millitorrs. In at least some embodiments, pressure to etch layer 107 is from about 100 millitorrs to about 200 millitorrs.

Figure 4:
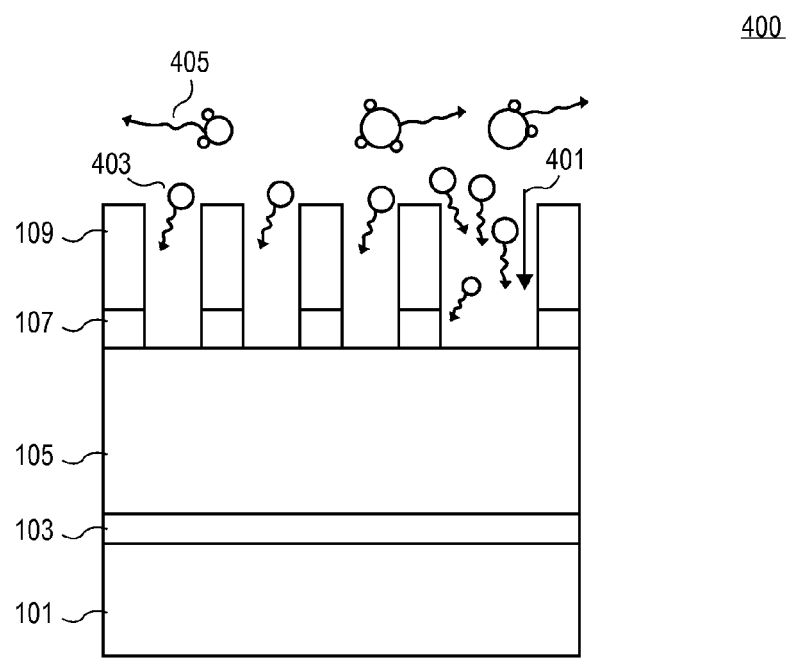
FIG. 4 is a view similar to FIG. 3 after openings in a first insulating layer are formed.

FIG. 4 is a view similar to FIG. 3 after openings in insulating layer 107, such as openings 401 are formed. Referring back to FIG. 8, method 800 continues with operation 805 involving forming one or more openings in one or more second insulating layer that includes etching one or more second insulating layers through the patterned organic hard mask layer and the openings in the first insulating layer using one or more fourth gases having a third iodine content. In at least some embodiments, when the organic hard mask layer is directly deposited onto the second insulating layer, operation 804 is skipped. As shown in FIG. 4, insulating layer 105 (e.g., a silicon oxide layer) is plasma etched through the openings in insulating layer 107, using iodine containing gas 403.

As shown in FIG. 4, the etched insulating layer 107 and hard mask layer 109 act as a mask to etch insulating layer 105. In at least some embodiments, gas 403 contains iodine, carbon and fluorine. In at least some embodiments, gas 403 is trifluoroiodomethane ("$CF_3I$"). In at least some embodiments, gas 403 is $CF_3I$, $C_2F_5I$, $C_3F_7I$, or any combination thereof. In at least some embodiments, gas 403 such as $CF_3I$, $C_2F_5I$, $C_3F_7I$, or any combination thereof is added to a baseline gas flow containing $C_xH_zF_y$, oxygen, and argon, where x, y can be any integer number excluding 0, and z can be any integer number including 0. In at least some embodiments, $CF_3I$ is added to a baseline gas flow containing $C_4F_6$, $C_4F_8$, or any combination thereof, and oxygen, and argon. In at least some embodiments, a content ratio of the iodine containing gas 403 such as $CF_3I$, $C_2F_5I$, $C_3F_7I$, or any combination thereof in the base gas flow is from about 0.5% to about 1%. In more specific embodiments, openings in insulating layer 105 (e.g., a silicon oxide layer) are formed by adding from about 5 sccm to about 10 sccm of $CF_3I$ to the base gas flow containing $C_xH_mF_y$, where x, m, and y are integer numbers excluding zero, oxygen, and argon into a plasma etching chamber.

As shown in FIG. 4, iodine molecules react with aggressive free fluorine radicals F in the plasma providing stable inter-halogen compounds, such as an inter-halogen compound 405 that minimizes the effect of the free radicals on the etched insulating layer 107 and hard mask layer 109. That is, adding iodine containing gas 403 to plasma etch insulating layer 105 allows to preserve the integrity of the above masking layers, such as layers 109 and 107 during the etching process.

In at least some embodiments, fluorine ions produced from iodine containing gas 403, such as gas $CF_3I$, improve etching efficiency of the insulating layer 105. That is, adding iodine containing gas, such as $CF_3I$ gas, to the baseline gas flow has a double benefit: it improves the etching efficiency of the underlying layer (e.g., layer 105) and preserves the integrity of the above mask layer (e.g., organic mask 109 and insulating layer 107).

Maintaining the organic mask integrity provides a substantially striation free etched insulating layer 105. Additionally, adding iodine containing gas 403 to etch insulating layer 105 showed a clogging-free hole profile in the insulating layer 105, and provides bowing controllability. Adding iodine containing gas 403 to etch insulating layer 105 allows controlling of the mask profile and striation by high silicon based passivation. Adding iodine containing gas 403 to etch insulating layer 105 increases Si/C ratio at least from about 0.5 to about 6.1, and increases Si/O ratio from about 4.0 to about 21.

Overall, adding iodine containing gas, for example, $CF_3I$, $C_2F_5I$, $C_3F_7I$, or any combination thereof, to the baseline gas flow, for example, containing $C_xH_zF_y$, oxygen, and argon, where x, y can be any integer number excluding zero, and z can be any integer number including zero, to plasma etch one or more isolating layers underneath one or more masking layers, has a double benefit: it improves the etching efficiency of the one or more underlying layers and preserves the integrity of the one or more masking layers.

Preserving the integrity of the masking layers during the plasma etching as described in operations 802, 804, and 805 provides bowing control of the wafer. For example, adding $CF_3I$ gas to an oxide etch process for HARC showed clogging-free hole profile, striation-free, mask deformation free etched SiN, and clear mask top surface. In at least some embodiments, the inter-halogen compounds, such as compound 405, are removed from a wafer placed in a plasma etching chamber by using a vacuum pump. In at least some embodiments, the openings in the insulating layer 105 are plasma etched at temperature in an approximate range of 0° C. to 60° C. In at least some embodiments, pressure to etch layer 105 is in an approximate range of 10 millitorrs to about 200 millitorrs. In at least some embodiments, pressure to etch layer 105 is from about 10 millitorrs to about 90 millitorrs.

Referring back to FIG. 8, method 800 continues with operation 806 involving stripping off the patterned organic hard mask layer 109 from the insulating layer. The organic hard mask layer can be removed from the insulating layer using one of technique known to one of ordinary skill in the electronic device manufacturing.

Figure 5:
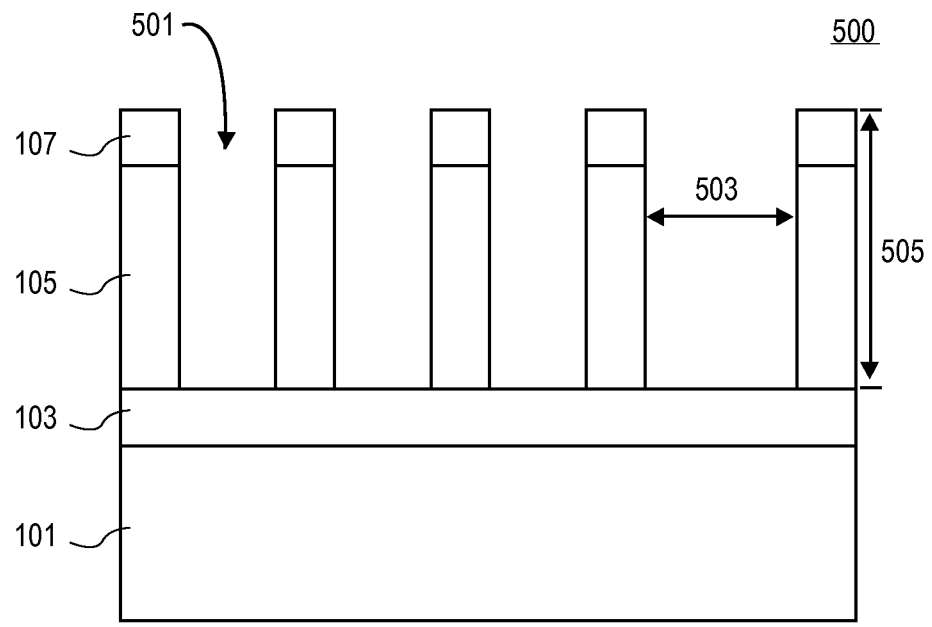
FIG. 5 is a view similar to FIG. 4 after openings in a second insulating layer are formed and the organic hard mask layer is stripped out.

FIG. 5 is a view similar to FIG. 4 after hard mask layer 109 is removed. As shown in FIG. 5, openings, such as opening 501, are formed in the insulating layer 105 and insulating layer 107. In at least some embodiments, the width 503 of the opening is from about 10 nm to about 60 nm. In at least one embodiment, the openings, such as opening 501 are holes. In at least some other embodiments, the openings are trenches. In at least some embodiments, the depth 505 of the opening is determined by the thickness of the masking layer, the thickness of the etched layer, or a combination thereof. In at least some embodiments, the opening has a depth in the approximate range of 10 microns ("µm") to 100 µm. In at least some embodiments, opening 501 has a substantially high aspect ratio of depth to diameter, for example, in the approximate range of 10:1 to 70:1.

Figure 9:
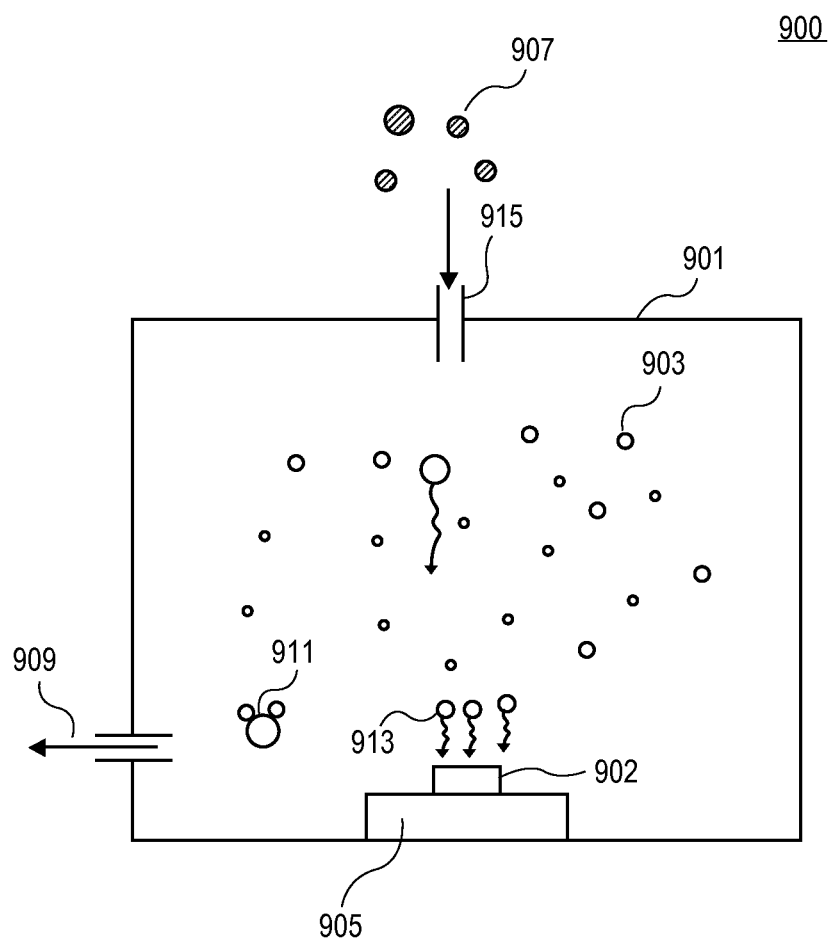
FIG. 9 shows a block diagram of an exemplary embodiment of a plasma etching system to perform one or more methods described herein.

FIG. 9 shows a block diagram of one embodiment of a plasma etching system 900 to perform one or more methods described herein. As shown in FIG. 9, system 900 has an etching chamber 901 containing plasma 903 to etch a wafer 905 on a stage 905. Generally, plasma 903 contains atoms, molecular radicals and positive ions that are more chemically reactive than the normal molecular gases from which the species are created. Typically, plasma 903 is generated under low pressure (vacuum) by an electromagnetic field. Typically, high-energy ions 913 from the plasma attack the surface of wafer 902 and react with it.

Etching chamber 901 has a gas inlet 915 to receive a process gas 907 having an iodine content at a low pressure, as described above. In at least some embodiments, the process gas 907 contains iodine, carbon and fluorine, as described above. In at least some embodiments, plasma 903 is produced from the process gas 907 using a high frequency electric field. In at least some embodiments, etching chamber 901 is coupled to a RF source power (not shown), and to two RF bias powers (not shown) to produce plasma 903. Typically, at least one RF bias is applied to stage 905 to create directional electric fields near the wafer to achieve more anisotropic etch profiles.

In at least some embodiments, the process gas is ionized in a vacuum system using RF excitations. In at least one embodiment, for system 900 the frequency of the source power process is about 162 MHz, the frequency of one bias power process is about 2 MHz and the frequency of another bias power process is about 60 MHz.

Etching chamber 901 has an outlet 909 connected to a vacuum pump system (not shown) to evacuate the air including inter-halogen compounds 911 out of the etching chamber. As shown in FIG. 9, inter-halogen compounds 911 are removed from the surface of the wafer 907 via the outlet 909. The inter-halogen compounds 911 are produced by reaction between free fluorine radicals and iodine atoms generated from the process gas, as described above with respect to FIGS. 1-5.

In at least some embodiments, plasma etching system 900 is a Reactive Ion Etching ("RIE") system. In at least some embodiments, plasma etching system 900 is an inductively coupled plasma ("ICP") etch system. The plasma etching system 900 can be, for example, Enabler E2, Enabler E5 and Enabler ZON plasma etching systems produced by Applied Materials, Inc., located in Santa Clara, Calif.

Figure 6:
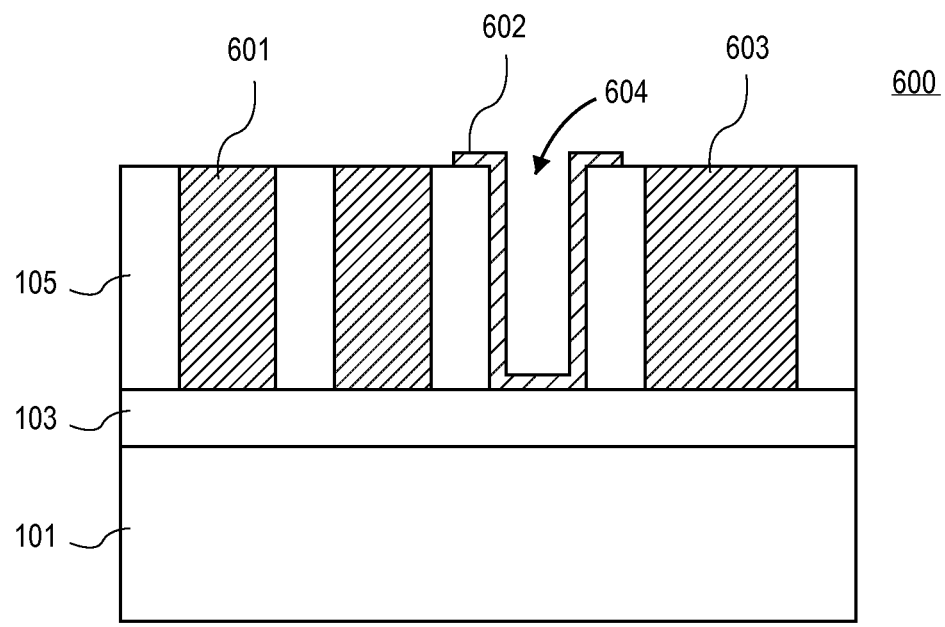
FIG. 6 is a view similar to FIG. 5 after one or more conductive layers are deposited into the openings in the insulating layer.

Referring back to FIG. 8, method 800 continues with operation 808 that involves depositing a conductive layer into the one or more openings in the insulating layer. FIG. 6 is a view similar to FIG. 5 after one or more conductive layers are deposited into the openings in the insulating layer 105. For example, openings 601 and 603 can be filled with a conductive material, and opening 604 has a conductive layer 602 deposited thereon. In at least some embodiments, the conductive material for one or more conductive layers includes a metal, for example copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In at least some embodiments, the conductive material for one or more conductive layers includes titanium nitride ("TiN"), tantalum nitride ("TaN"), any other like material, or any combination thereof. In another embodiment, the conductive material for one or more conductive layers an electrically conductive semiconductor material.

In at least some embodiments, the dielectric plasma etch methods and apparatuses as described herein can be used in a via contact, capacitior contact, high aspect ratio ("HAR") contact, an interconnect device, Line/Space trench, Hard Mask Open ("HMO"), 3D multilayered contact/multilayered trench ("MLC/MLT"), 3D Bit Cost Scalable ("BiCS"), Dual damascene, Metal contact and the like technologies to manufacture, for example, Dynamic Random Access Memory ("DRAM"), Flash memory, and Logic devices.

Various device components of stacked semiconductor structures may couple to each other by vias, interconnects, trenches, and the like. For example, forming a 3D interconnect so that it electrically bonds the stacked semiconductor structures or components for various integrated circuit applications may require etching a high-aspect ratio, deep opening in a patterned thick semiconductor structure or a substrate using apparatuses and methods as described herein, and filling it with a conductive material. Further, the sidewalls of the openings formed using the methods and apparatuses as set forth herein are smooth and uniform. That allows the conductive material to uniformly fill the openings to ensure a reliable electrical connection, for example, between stacked semiconductor wafers, or between elements of the devices in the integrated circuit applications.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with system 900 described in association with FIG. 9. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.), etc.

Figure 10:
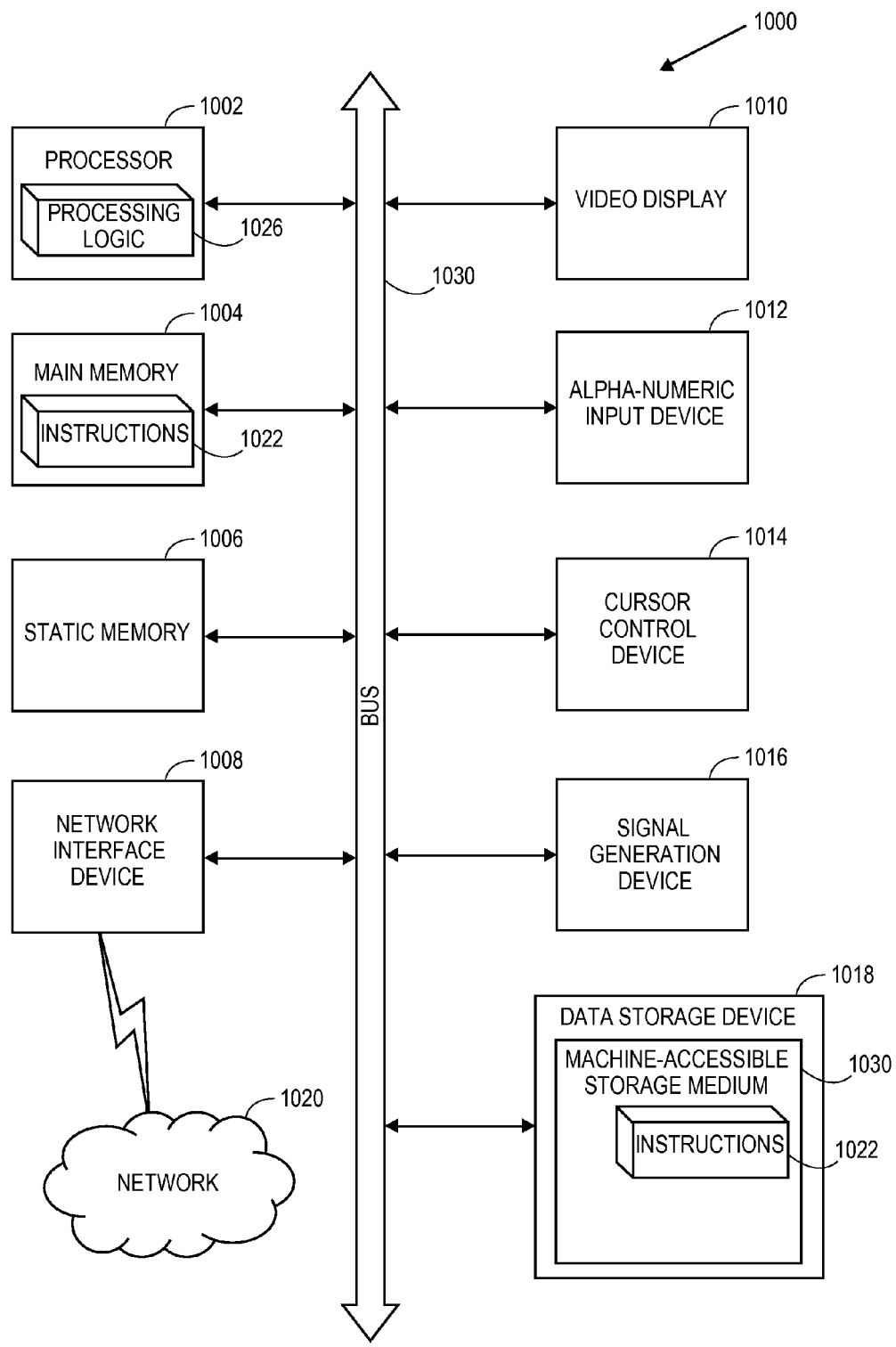
FIG. 10 shows a block diagram of an exemplary embodiment of a data processing system to control a plasma etching system to perform one or more methods described herein.

FIG. 10 shows a block diagram of an exemplary embodiment of a data processing system 1000 to control a plasma etching system to perform any one or more of the methods described herein. The plasma etching system, for example, plasma etching system 900, can be connected to a data processing system, for example, data processing system 1000. In at least some embodiments, the data processing system controls the plasma etching system to perform operations involving forming one or more openings in an organic mask layer on a first insulating layer over a substrate; and forming through the one or more first openings one or more second openings in the first insulating layer using a first iodine containing gas, as described herein.

In alternative embodiments, the data processing system may be connected (e.g., networked) to other machines in a Local Area Network (LAN), an intranet, an extranet, or the Internet. The data processing system may operate in the capacity of a server or a client machine in a client-server network environment, or as a peer machine in a peer-to-peer (or distributed) network environment. The data processing system may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that data processing system. Further, while only a single data processing system is illustrated, the term "data processing system" shall also be taken to include any collection of data processing systems that individually or jointly execute a set (or multiple sets) of instructions to perform any one or more of the methodologies described herein.

The exemplary data processing system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1031 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to manufacture an integrated circuit, comprising:
   forming one or more openings in an organic mask layer on a first insulating layer on a second insulating layer over a substrate;
   forming through the one or more openings in the organic layer one or more openings in the first insulating layer using a first iodine containing gas; and
   forming through the one or more openings in the first insulating layer one or more openings in the second insulating layer using a second iodine containing gas different from the first iodine containing gas.

2. The method of claim 1, wherein an antireflective layer is deposited on the organic mask layer, and wherein the method further comprises forming one or more openings in the antireflective layer down to the organic mask layer using a third iodine containing gas.

3. The method of claim 1, wherein the one or more openings in the organic layer are formed using a fourth gas.

4. The method of claim 1, wherein the first iodine containing gas further contains a carbon and a fluorine.

5. The method of claim 1, further comprising
   removing the organic mask layer; and
   depositing one or more conductive layers into at least one of the openings in the first insulating layer.

6. The method of claim 1, wherein a content of the first iodine containing gas in a gas flow is in a range of 0.1 to 10 percents.

7. The method of claim 1, wherein first insulating layer includes an oxide.

8. The method of claim 1, wherein the first insulating layer includes a silicon nitride.

9. A method to maintain a mask integrity, the method comprising:
   etching an antireflective layer down to an organic mask layer on a first insulating layer on a second insulating layer over a substrate using a first iodine containing gas, the antireflective layer is deposited on the organic mask layer;
   forming one or more openings in the organic mask layer;
   etching the first insulating layer through the one or more openings in the organic mask layer using a second iodine containing gas; and
   etching the second insulating layer through one or more openings in the first insulating layer using a third iodine containing gas different from the second iodine containing gas.

10. The method of claim 9, wherein the antireflective layer contains a dielectric layer.

11. The method of claim 9, further comprising
    patterning a photoresist layer on the antireflective layer.

12. The method of claim 9, wherein the first iodine containing gas contains a CxFyI.

13. The method of claim 9, wherein a content of at least one of the first iodine containing gas and the second iodine containing gas in a gas flow is in a range of 0.1-10 percent.

* * * * *

UNITED STATES PATENT AND TRADEMARK OFFICE
CERTIFICATE OF CORRECTION

| | | |
|---|---|---|
| PATENT NO. | : 8,603,921 B2 | Page 1 of 1 |
| APPLICATION NO. | : 13/190392 | |
| DATED | : December 10, 2013 | |
| INVENTOR(S) | : Daisuke Shimizu et al. | |

It is certified that error appears in the above-identified patent and that said Letters Patent is hereby corrected as shown below:

In the Specification

In column 2 at line 8 after "gas" insert --.--

In column 2 at line 33 after "gas" delete "iodine containing gas"

In column 5 at line 42 delete "111" and insert --109--

In column 5 at line 53 delete "UVLithography" and insert --UV lithography--

In column 6 at line 12 delete "121" and insert --125--

In column 10 at line 51 delete "808" and insert --807--

In column 11 at line 1 after "layers" insert --is--

Signed and Sealed this
Thirteenth Day of May, 2014

Michelle K. Lee
*Deputy Director of the United States Patent and Trademark Office*